United States Patent [19]

Chang

[11] Patent Number: 5,207,836
[45] Date of Patent: May 4, 1993

[54] CLEANING PROCESS FOR REMOVAL OF DEPOSITS FROM THE SUSCEPTOR OF A CHEMICAL VAPOR DEPOSITION APPARATUS

[75] Inventor: Mei Chang, Cupertino, Calif.

[73] Assignee: Applied Materials, Inc., Santa Clara, Calif.

[21] Appl. No.: 894,180

[22] Filed: Jun. 3, 1992

Related U.S. Application Data

[63] Continuation of Ser. No. 707,214, May 23, 1991, abandoned, which is a continuation of Ser. No. 389,689, Aug. 25, 1989, abandoned.

[51] Int. Cl.$^5$ .................................................. B08B 3/00
[52] U.S. Cl. ........................................... 134/1; 134/26; 134/30; 134/31; 156/643
[58] Field of Search ................... 134/1, 26, 31, 30; 156/643; 204/192.32, 192.35, 192.37

[56] References Cited

U.S. PATENT DOCUMENTS

| | | | |
|---|---|---|---|
| 4,134,817 | 1/1978 | Bourdon | 156/643 |
| 4,713,141 | 12/1987 | Tsang | 156/643 |
| 4,838,990 | 6/1989 | Jucha et al. | 204/192.35 |
| 4,915,777 | 4/1990 | Jucha et al. | 156/643 |
| 4,923,828 | 5/1990 | Gluck et al. | 156/643 |

FOREIGN PATENT DOCUMENTS

| | | |
|---|---|---|
| 0237153 | 9/1987 | European Pat. Off. . |
| 0296891 | 12/1988 | European Pat. Off. . |
| 62-291664 | 12/1987 | Japan . |

OTHER PUBLICATIONS

Translation of Japanese Patent 62-291664.

Primary Examiner—Theodore Morris
Assistant Examiner—Saeed T. Chaudhry
Attorney, Agent, or Firm—John P. Taylor

[57] ABSTRACT

An improved process is disclosed for the removal of deposits such as tungsten or tungsten silicide from a susceptor in a vacuum deposition chamber without leaving fluorine residues by first flowing a gaseous source of fluorine into a vacuum deposition chamber and igniting a plasma in the chamber while the gaseous source of fluorine is flowing therein to remove the depositions followed by flowing a gaseous source of hydrogen into the chamber and maintaining a plasma in the chamber during the flow of the gaseous source of hydrogen to remove any fluorine residues from the chamber.

20 Claims, 1 Drawing Sheet

---

REMOVING DEPOSITS FROM A SUSCEPTOR IN A CVD CHAMBER BY FLOWING A GASEOUS SOURCE OF FLUORINE THROUGH THE CHAMBER AND IGNITING A PLASMA

↓

SHUTTING OFF THE FLOW OF THE GASEOUS SOURCE OF FLUORINE AND EXTINGUISHING THE PLASMA AFTER REMOVAL OF THE DEPOSITS

↓

REMOVING FLUORINE RESIDUES FROM THE CVD CHAMBER BY FLOWING A GASEOUS SOURCE OF HYDROGEN THROUGH THE CHAMBER AND IGNITING A PLASMA

```
┌─────────────────────────────────────┐
│ REMOVING DEPOSITS FROM A SUSCEPTOR  │
│    IN A CVD CHAMBER BY FLOWING A    │
│ GASEOUS SOURCE OF FLUORINE THROUGH  │
│  THE CHAMBER AND IGNITING A PLASMA  │
└─────────────────────────────────────┘
                   │
                   │
┌─────────────────────────────────────┐
│   SHUTTING OFF THE FLOW OF THE      │
│ GASEOUS SOURCE OF FLUORINE AND      │
│ EXTINGUISHING THE PLASMA AFTER      │
│       REMOVAL OF THE DEPOSITS       │
└─────────────────────────────────────┘
                   │
                   │
┌─────────────────────────────────────┐
│ REMOVING FLUORINE RESIDUES FROM     │
│    THE CVD CHAMBER BY FLOWING A     │
│ GASEOUS SOURCE OF HYDROGEN THROUGH  │
│  THE CHAMBER AND IGNITING A PLASMA  │
└─────────────────────────────────────┘
```

CLEANING PROCESS FOR REMOVAL OF DEPOSITS FROM THE SUSCEPTOR OF A CHEMICAL VAPOR DEPOSITION APPARATUS

This is a continuation of copending application Ser. No. 07/707,214 filed on May 23, 1991 now abandoned, which was a continuation of Ser. No. 07/389,689 filed on Aug. 25, 1989 now abandoned.

BACKGROUND OF THE INVENTION

1. Field of the Invention

This invention relates to the processing of semi-conductor wafers in a vacuum deposition apparatus. More particularly, this invention relates to an improved cleaning process for the removal of deposits, such as tungsten or tungsten silicide deposits, from a vacuum deposition apparatus without leaving fluorine residues.

2. Description of the Related Art

In the processing of a semiconductor wafer to form integrated circuit structures therein, it is desirable to deposit materials such as, for example, tungsten on the wafer by a chemical vapor deposition (CVD) process, either by a blanket deposition followed by a patterning step, or by selective deposition of tungsten over a mask layer, such as an oxide layer, already patterned to expose silicon or aluminum surfaces on which the tungsten will selectively deposit.

In either case, deposits of materials such as tungsten usually accumulate on the susceptor (base or support on which the semiconductor wafer rests during the deposition) in the CVD deposition chamber and such deposits must be removed periodically since they tend to change the dimensions of the chamber as well as to flake off the susceptor surfaces and onto the wafer being processed in the chamber, or change the deposition environment chemically, especially for subsequent selective deposition processes.

In the prior art, it has been conventional to remove such deposits using a plasma-assisted fluorine etch. A gaseous source of fluorine is fed into the vacuum deposition chamber and a plasma is then ignited in the chamber during the gas flow, by connecting to an rf source the faceplate through which gases are fed into the vacuum deposition chamber during the deposition. The base or susceptor on which the wafer normally rests during the CVD deposition will be grounded. The resulting fluorine chemistry reacts with the deposits, such as tungsten or tungsten silicide deposits, and the resulting reaction product is removed from the chamber by the vacuum evacuation system.

While this process satisfactorily removes tungsten or other deposits from the susceptor in the vacuum chamber, the cleaning process, in turn, leaves fluorine residues in the vacuum chamber which can interfere, for example, with subsequent tungsten depositions therein. If such a subsequent tungsten deposition in the chamber is a blanket deposition, the resulting tungsten layer will be non-uniform in thickness, probably due to inhibition of the tungsten deposition by the fluorine residues. If the next deposition is a selective tungsten deposition, the presence of fluorine residues in the chamber inhibits the deposition of tungsten on the exposed silicon or aluminum surfaces.

It would, therefore, be desirable to provide an improved process for the removal of deposits, such as tungsten and tungsten silicide deposits, from the susceptor in a vacuum chamber after a deposition such as a CVD tungsten depositions wherein no fluorine residues would remain in the deposition chamber at the conclusion of the cleaning process.

SUMMARY OF THE INVENTION

It is, therefore, an object of this invention to provide an improved process for the removal of deposits, such as tungsten or tungsten silicide deposits, from the susceptor in a vacuum deposition chamber wherein fluorine residues, remaining from a first cleaning step to remove such deposits on the susceptor surfaces, are removed in a second cleaning step.

It is another object of this invention to provide an improved process for the removal of deposits, such as tungsten or tungsten silicide deposits, from the surfaces of a susceptor in a vacuum deposition chamber wherein fluorine residues, remaining from a first cleaning step to remove such deposits, are removed in a second cleaning step by contacting the fluorine residues with a gaseous source of hydrogen in a plasma-assisted etch.

It is still another object of this invention to provide an improved process for the removal of deposits, such as tungsten or tungsten silicide deposits, from a vacuum deposition chamber which comprises using a plasma-assisted fluorine etch in a first step to remove such deposits and a plasma-assisted hydrogen etch in a second cleaning step to remove fluorine residues remaining from the first cleaning step.

These and other objects of the invention will be apparent from the following description and accompanying flowsheet.

BRIEF DESCRIPTION OF THE DRAWING

The sole drawing is a flowsheet illustrating the process of the invention.

DETAILED DESCRIPTION OF THE INVENTION

In accordance with the invention, deposits such as tungsten or tungsten silicide deposits, remaining from a CVD process for depositing same on a semi-conductor wafer are removed from the susceptor in a vacuum deposition chamber without leaving fluorine residues by first flowing a gaseous source of fluorine into a vacuum deposition chamber and igniting a plasma in the chamber while the gaseous source of fluorine is flowing therein to remove the deposits; and then flowing a gaseous source of hydrogen into the chamber while maintaining a plasma in the chamber during the flow of the gaseous hydrogen source through the chamber to remove any fluorine residues remaining in the chamber.

The buildup of deposits, such as tungsten or tungsten silicide, on the surfaces of the susceptor in a vacuum chamber used for the chemical vapor deposition (CVD) of such materials on a semi-conductor wafer is first removed by flowing a gaseous source of fluorine through the vacuum chamber at a flow rate within a range of from about 20 to about 200 standard cubic centimeters per minute (sccm) while maintaining the pressure in the vacuum chamber within a range of from about 0.2 to about 1 Torr and the temperature within a range of from about 150° C. to about 525° C., preferably within a range of from about 450° C. to about 475° C. when the chamber and the susceptor are used for blanket depositions, and preferably within the range of from about 250° C. to about 400° C. when the chamber and the susceptor therein are used for selective depositions.

The gaseous source of fluorine may comprise any one or more fluorine-containing gases capable of forming fluorine radicals to cause reaction between such fluorine radicals and the deposits. Examples of such fluorine-containing gases include $SF_6$, $CF_4$, $C_2F_6$, and $NF_3$. The gaseous source of fluorine may further include inert or non-reactive gases such as argon, neon, or helium at a flow rate of up to 200 sccm. When such inert gases are mixed with the gaseous source of fluorine, the total flow of gas into the chamber is the sum of the mixture, i.e., the amount of the fluorine-containing gas entering the chamber should not be diminished by the presence of the inert gas in the gas mixture.

While the gaseous source of fluorine is flowing through the vacuum chamber, a plasma is ignited in the chamber by energizing an rf source connected between two electrodes in the chambers which may be spaced within a range of from about 200 to about 1000 mils apart. These two electrodes will normally respectively comprise the grounded base or susceptor, and the faceplate or "showerhead" through which the gaseous source of fluorine is distributed into the vacuum chamber, and which is directly connected to the rf power source.

The power used by the rf source to maintain the plasma in the vacuum chamber will normally be within a range of from about 50 to about 400 watts, with the actual amount of power used depending upon the size of the susceptor in the chamber, which will, in turn, depend upon the size of the wafers which have been previously processed in the chamber.

The time period during which the plasma-assisted fluorine etch is carried out will depend upon the thickness of the tungsten deposits or residues in the chamber as well as the power level and the flow rate of the gaseous fluorine source. The higher the flow rate and/or the higher the power level, within the ranges discussed above, the faster the tungsten deposits will be removed. Usually the time will be within a range of from about 30 seconds to about 2 minutes per micron of thickness of deposited material on the susceptor surfaces.

After the deposits have been removed from the susceptor in the vacuum chamber, in accordance with the improved process of the invention, the resulting fluorine residues must be removed to avoid interference by such fluorine residues with subsequent depositions to be carried out in the cleaned vacuum deposition chamber.

The fluorine residues are removed by flowing a gaseous source of hydrogen through the vacuum chamber while maintaining a plasma flow in the chamber. The gaseous source of hydrogen should be flowed through the chamber at a flow rate within a range of from about 100 to about 500 sccm while maintaining the other reaction conditions the same as during the fluorine etch, i.e., a pressure within a range of from about 0.2 to about 1 Torr, and a temperature within a range of from about 150° C. to about 525° C., preferably either within a range of from about 450° C. to about 475° C., or within a range of from about 250° C. to about 400° C., depending upon the intended use of the susceptor and the deposition chamber as previously discussed with respect to the fluorine etch.

As in the first cleaning step, the gaseous source of hydrogen may further optionally include inert or non-reactive gases such as argon, neon, or helium in amounts of up to about 200 sccm which flow rate is additive to the flow rate of the gaseous source of hydrogen in computing the total flow rate of gases into the vacuum chamber during this second cleaning step.

Examples of hydrogen-containing gases which may be used in this step of the process include hydrogen ($H_2$), boron hydride ($B_2H_6$), phosphorus hydride ($PH_3$), and organic sources such as 1-2 carbon hydrocarbons, e.g., $CH_4$, and $C_2H_6$, although the use of $H_2$ is preferred. When the subsequent deposition in the chamber is to be a blanket tungsten deposit, silane ($SiH_4$) may also be used as the source of hydrogen. However, silane should not be used if the subsequent tungsten depositions are to be selective depositions, since silane will leave some silicon residues which will not interfere with a blanket tungsten deposition, but may interfere with a selective tungsten deposition, for example, over a silicon oxide mask.

The reaction between the fluorine residues and the hydrogen-containing gas is also assisted by a plasma which is maintained in the chamber during the flow of the gaseous hydrogen source through the chamber. As in the fluorine etch, the power level of the plasma, during the flow of the hydrogen-containing gas through the chamber, is maintained within a range of from about 50 to about 400 watts and the spacing between the electrodes in the chamber is maintained within a range of from about 200 to about 1000 mils.

The plasma assisted hydrogen etch is carried out for a time period ranging from about 20 seconds to about 5 minutes to remove the fluorine residues from the chamber. Longer time periods are possible but are usually not necessary and are not, therefore, economically feasible. The actual amount of time needed to remove all of the fluorine residues will also be dependent on the plasma power and the flow rate of the gaseous source of hydrogen through the chamber.

Whether or not the time period for the plasma assisted hydrogen etch has been long enough to remove all of the fluorine residues can be empirically ascertained, if necessary, by examining the uniformity of a subsequent blanket deposition, for example, of a tungsten layer on a semiconductor wafer. If the thickness of the tungsten layer does not vary by more than about 1% across the wafer, all of the fluorine residues have been removed. On the other hand, if some of the fluorine residues remain in the chamber, the thickness of the tungsten layer may vary by as much as 3-4% across the surface of the wafer.

In a preferred embodiment, the flow of the gaseous source of fluorine is stopped, i.e., the gas is shut off, and the plasma extinguished after the first cleaning step. This avoids undesired reaction between the gaseous source of fluorine and the gaseous source of hydrogen as might otherwise occur if the two cleaning steps were merged by gradually turning off the flow of the gaseous source of fluorine while gradually turning on the flow of the gaseous source of hydrogen. After the flow of the gaseous source of hydrogen into the vacuum chamber commences, the plasma is reignited and then remains on during the second cleaning step.

The following example will serve to further illustrate the improved cleaning process of the invention.

EXAMPLE

A vacuum deposition chamber which had been used for the deposition of tungsten on semiconductor wafers, and which had accumulated CVD tungsten deposits of an average thickness of about 1 micron on the surfaces of the susceptor, was cleaned by first flowing $NF_3$ through the vacuum chamber at a flow rate of 100 sccm while maintaining a pressure in the chamber of 0.75 Torr and a temperature of 450° C. A plasma was ignited in the chamber during the $NF_3$ flow at a power level of 200 watts and the spacing between the grounded susceptor or base and the faceplate, which served as the electrode connected to the rf power source, was 500 mils. The plasma-assisted fluorine etch was carried out for 2 minutes, after which the flow of $NF_3$ was shut off and the plasma extinguished.

Following the fluorine etch, hydrogen ($H_2$) was flowed through the chamber at 200 sccm while still maintaining the vacuum chamber at 0.75 Torr and at a temperature of 450° C. During the hydrogen flow through the chamber, a plasma was again ignited between the base and the faceplate at a power level of 200 watts. The plasma-assisted hydrogen etch was carried out for 30 seconds.

To test the effectiveness of the cleaning process, a semiconductor wafer was then loaded onto the cleaned susceptor and a blanket deposit of a tungsten layer was CVD applied to the wafer. The wafer was then removed from the chamber and the tungsten layer was examined for uniformity and found to have less than 1% variation in thickness.

Thus, the invention provides an improved process for the removal of accumulated deposits of materials such as tungsten or tungsten silicide from the surfaces of a susceptor in a CVD deposition chamber without leaving undesired fluorine residues by first removing the deposits with a plasma-assisted fluorine etch and then removing the fluorine residues with a plasma-assisted hydrogen etch.

Having thus described the invention, what is claimed is:

1. An improved process for removing deposits of tungsten and/or tungsten silicide from a vacuum deposition chamber after processing of a semiconductor wafer therein which comprises:
   (a) flowing into said vacuum deposition chamber a gaseous source of fluorine capable of reacting with said deposits of tungsten or tungsten silicide;
   (b) igniting a plasma in said chamber while said gaseous source of fluorine is flowing therein and reacting with said deposits of tungsten or tungsten silicide;
   (c) stopping said flow of said gaseous source of fluorine into said chamber and extinguishing said plasma;
   (d) then flowing a gaseous source of hydrogen into said chamber to remove fluorine residues remaining from said reaction of said gaseous source of fluorine with said deposits of tungsten or tungsten silicide; and
   (e) maintaining a plasma in said chamber during said flow of said gaseous source of hydrogen therein.

2. The process of claim 1 wherein said gaseous source of fluorine flows through said chamber at a rate within a range of from about 20 to about 200 sccm.

3. The process of claim 2 wherein the power of said plasma varies within a range of from about 50 to about 400 watts as said gaseous source of fluorine flows through said chamber.

4. The process of claim 1 wherein said gaseous source of hydrogen flows through said chamber at a rate within a range of from about 100 to about 500 sccm.

5. The process of claim 4 wherein the power of said plasma varies within a range of from about 50 to about 400 watts as said gaseous source of hydrogen flows through said chamber.

6. The process of claim 1 wherein said vacuum chamber is maintained within a pressure range of from about 0.2 to about 1 Torr during said cleaning process.

7. The process of claim 1 wherein said susceptor is maintained within a temperature range of from about 150° C. to about 525° C. during said cleaning process.

8. An improved process for removing from a susceptor deposits of tungsten or tungsten silicide remaining from the process of a semiconductor wafer in a vacuum deposition chamber maintained within a pressure range of from about 0.2 to about 1 Torr during said cleaning process which consists essentially of:
   (a) heating said susceptor and maintaining it within a temperature range of from about 150° C. to about 525° C. during said cleaning process;
   (b) flowing into said vacuum deposition chamber at a rate within a range of from about 20 to about 200 sccm a gaseous source of fluorine capable of reacting with said deposits of tungsten or tungsten silicide;
   (c) igniting a plasma in said chamber at a power level within a range of from about 50 to about 400 watts while said gaseous source of fluorine is flowing therein and reacting with said deposits of tungsten or tungsten silicide;
   (d) stopping said flow of said gaseous source of fluorine into said chamber and extinguishing said plasma;
   (e) then flowing a gaseous source of hydrogen into said chamber at a rate within a range of from about 100 to about 500 sccm to remove fluorine residues remaining from said step of flowing said gaseous source of fluorine into said chamber for reaction with said deposits of tungsten or tungsten silicide; and
   (f) igniting a plasma in said chamber at a power level within a range of from about 50 to about 400 watts while said gaseous source of hydrogen is flowing therein.

9. The process of claim 8 wherein said susceptor is maintained within a temperature range of from about 450° C. to about 475° C. during said cleaning process.

10. The process of claim 8 wherein said susceptor is maintained within a temperature range of from about 250° C. to about 400° C. during said cleaning process.

11. The process of claim 8 wherein said gaseous source of hydrogen is selected from the class consisting of $H_2$, $B_2H_6$, $PH_3$ and a 1-2 carbon hydrocarbon.

12. The process of claim 8 wherein said gaseous source of hydrogen comprises $H_2$.

13. The process of claim 8 wherein said gaseous source of fluorine is selected from the class consisting of $SF_6$, $CF_4$, $C_2F_6$, and $NF_3$.

14. An improved process for removing from a susceptor deposits of tungsten or tungsten silicide in a vacuum deposition chamber without leaving fluorine residues therein which consists essentially of:
   (a) first removing said deposits of tungsten or tungsten silicide from the susceptor by:
      (i) flowing a gaseous source of fluorine at a flow rate within a range of from about 20 to about 200 sccm through said vacuum deposition chamber while maintaining said vacuum chamber within a pressure range of from about 0.2 to about 1 Torr and said susceptor at a temperature with in a range of from about 150° to about 525° C., to react said gaseous source of fluorine with said deposits of tungsten or tungsten silicide; and (ii) igniting a plasma at a power level within a range of from about 50 to about 400 watts in said chamber while said gaseous source of fluorine is flowing therein and reacting with said deposits of tungsten or tungsten silicide;

(b) stopping said flow of said gaseous source of fluorine into said chamber and extinguishing said plasma; and (c) then removing the resultant fluorine residues from said reaction with said deposits of tungsten or tungsten silicide by:

(i) flowing a gaseous source of hydrogen into said chamber at a flow rate within a range of from about 100 to about 500 sccm while maintaining the pressure in said chamber within a range of from about 0.2 to about 1 Torr and said susceptor at a temperature within a range of from about 150° to about 525° C.; and (ii) igniting a plasma at a power level within a range of from about 50 to about 400 watts in said chamber during said flow of said gaseous source of hydrogen therein.

15. The process of claim 14 wherein said gaseous source of hydrogen is selected from the class consisting of $H_2$, $B_2H_6$, $PH_3$, and 1-2 carbon hydrocarbons.

16. The process of claim 14 wherein said gaseous source of hydrogen comprises $H_2$.

17. The process of claim 14 wherein said gaseous source of fluorine is selected from the class consisting of $SF_6$, $CF_4$, $C_2F_6$, and $N_3F$.

18. The process of claim 14 wherein said gaseous source of fluorine comprises $NF_3$.

19. An improved process for removing from a susceptor deposits of tungsten or tungsten silicide remaining from the process of a semiconductor wafer in a vacuum deposition chamber without leaving fluorine residues therein which consists essentially of:

(a) first removing said deposits of tungsten or tungsten silicide from the susceptor by:

(i) flowing a gaseous source of fluorine selected from the class consisting of $SF_6$, $CF_4$, $C_2F_6$, and $NF_3$ at a flow rate within a range of from about 20 to about 200 sccm into said vacuum deposition chamber while maintaining said chamber within a pressure range of from about 0.2 to about 1 Torr and said susceptor at a temperature within a range of from about 150° to about 525° C. to cause reaction between said gaseous source of fluorine and said deposits of tungsten or tungsten silicide; and (ii) igniting a plasma at a power level with a range of from about 50 to about 400 watts in said chamber while said gaseous source of fluorine is flowing therein and reacting with said deposits of tungsten or tungsten silicide;

(b) stopping said flow of said gaseous source of fluorine into said chamber and extinguishing said plasma; and (c) then removing the resultant fluorine residues in said chamber from said reaction between said gaseous source of fluorine and said deposits of tungsten or tungsten silicide by:

(i) flowing into said chamber a gaseous source of hydrogen selected from the class consisting of $H_2$, $B_2H_6$, $PH_3$ and 1-2 carbon hydrocarbons at a flow rate within a range of from about 100 to about 500 sccm while maintaining the pressure in said chamber within a range of from about 0.2 to about 1 Torr and said susceptor at a temperature within a range of from about 150° to about 525° C.; and (ii) igniting a plasma at a power level within a range of from about 50 to about 400 watts in said chamber during said flow of hydrogen therein.

20. An improved process for removing from a susceptor deposits of tungsten or tungsten silicide remaining from the process of a semiconductor wafer in a vacuum deposition chamber maintained within a pressure range of from about 0.2 to about 1 Torr during said cleaning process which consists essentially of:

(a) heating said susceptor and maintaining it within a temperature range of from about 150° C. to about 525° C. during said cleaning process;

(b) flowing into said vacuum deposition chamber at a rate within a range of from about 20 to about 200 sccm a gaseous source of $NF_3$ capable of reacting with said deposits of tungsten or tungsten silicide;

(c) igniting a plasma in said chamber at a power level within a range of from about 50 to about 400 watts while said gaseous source of $NF_3$ is flowing therein and reacting with said deposits of tungsten or tungsten silicide;

(d) stopping said flow of said gaseous source of $NF_3$ into said chamber and extinguishing said plasma;

(e) then flowing a gaseous source of hydrogen into said chamber at a rate within a range of from about 100 to about 500 sccm to remove fluorine residues remaining from said step of flowing said gaseous source of $NF_3$ into said chamber for reaction with said deposits of tungsten or tungsten silicide; and (f) igniting a plasma in said chamber at a power level within a range of from about 50 to about 400 watts while said gaseous source of hydrogen is flowing therein.

* * * * *